(12) United States Patent
Wang

(10) Patent No.: US 6,537,919 B1
(45) Date of Patent: Mar. 25, 2003

(54) PROCESS TO REMOVE MICRO-SCRATCHES

(75) Inventor: Ming-Tsong Wang, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/025,241

(22) Filed: Dec. 19, 2001

(51) Int. Cl.[7] ............... H01L 21/302; H01L 21/461; H01L 21/31
(52) U.S. Cl. ............................... 438/710; 438/761
(58) Field of Search ............................. 438/692, 707, 438/710, 759, 761

(56) References Cited

U.S. PATENT DOCUMENTS

| | | | |
|---|---|---|---|
| 5,516,729 A | 5/1996 | Dawson et al. | 437/228 |
| 5,915,175 A | 6/1999 | Wise | 438/238 |
| 6,110,795 A | 8/2000 | Liao | 438/424 |
| 6,180,525 B1 | 1/2001 | Morgan | 438/692 |
| 6,350,694 B1 * | 2/2002 | Chang et al. | 438/692 |

* cited by examiner

Primary Examiner—Alexander Ghyka
(74) Attorney, Agent, or Firm—George O. Saile; Stephen B. Ackerman

(57) ABSTRACT

Although CMP has been widely used with generally good results, one remaining problem is the occasional appearance of micro-scratches on the finished surface. Such micro-scratches may also be generated as a byproduct of processes other than CMP. The present invention solves this problem by exposing the surface in question to a gas plasma after the scratch generating process has been completed. Additionally, the invention discloses that the small amount of material that gets removed through exposure to the plasma may be replaced by deposition either in-situ or ex-situ. The added material may be the same as the removed material or a different material.

26 Claims, 2 Drawing Sheets

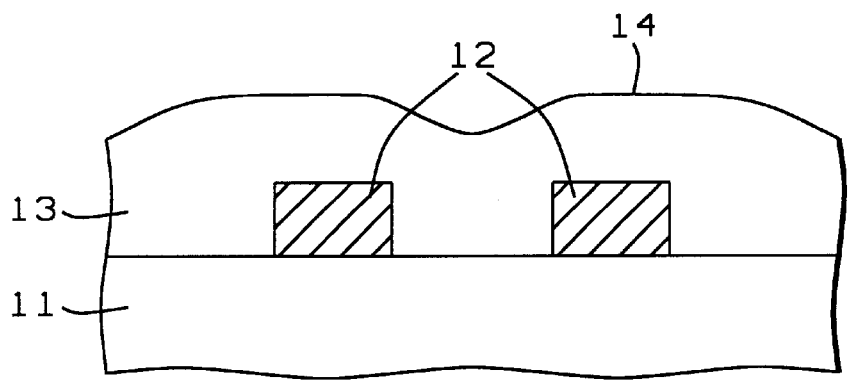
*FIG. 1 - Prior Art*
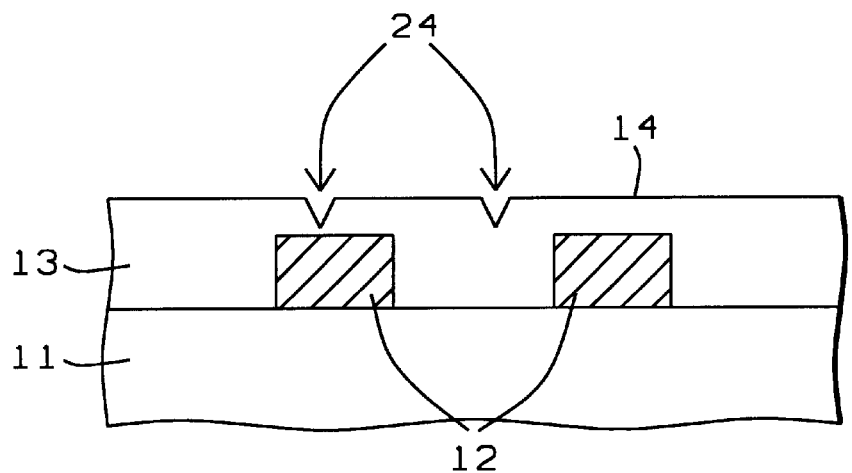
*FIG. 2 - Prior Art*
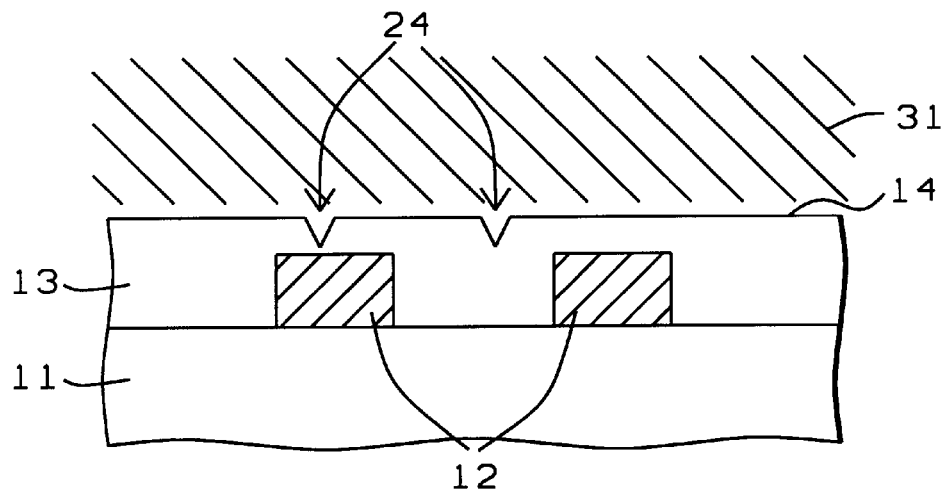
*FIG. 3*

PROCESS TO REMOVE MICRO-SCRATCHES

FIELD OF THE INVENTION

The invention relates to the general field of integrated circuit manufacture with particular reference to chemical mechanical polishing (CMP) and surface finishes obtained therewith.

BACKGROUND OF THE INVENTION

As the number of layers in an integrated circuit has grown, so has the need for frequent planarizing steps. Most purely chemical methods for etching tend to follow the contours of the surface being etched and/claim or to selectively etch parts of heterogeneous surfaces. Purely mechanical methods for surface removal (i.e. polishing) tend to provide a planar etch front but, if all surface damage is to be eliminated, require slurries so fine as to reduce etch time to unacceptably low levels.

The CMP process represents an excellent compromise between the two approaches. It has been applied for STI (shallow trench isolation), pre-metal dielectric, inter metal dielectric (IMD), to cite a few examples. The more advanced the technology is, the more likely it is that CMP processes will be used. One disadvantage of CMP processes, however, is that complete elimination of all scratches is hard to achieve. This is illustrated schematically in FIGS. 1 and 2 which show a substrate 11 on which are two protuberances 12 (typically metal lines) which have been over-coated with a layer 13 (typically a dielectric) resulting in an uneven top surface 14. After CMP, surface 14 is now essentially planar except for the presence of micro-scratches 24. By "micro-scratches" we imply that the scratches are no more than about 5,000 Angstroms deep.

From the FA (failure analysis) of products, the killing ratio for micro-scratches associated with CMP and other processes has been determined to be as much as 2 to 3% per layer. There is therefore strong motivation to eliminate this problem. Several methods had been tried to reduce such micro-scratches. For example, the slurry (abrasives), pad life, rotation speed, downward pressure (between wafer and pad), and oxide buffing have all been tried with varying degrees of success, with oxide buffing doing best. However, this latter approach turns out to be at the expense of range and uniformity.

The present invention discloses an approach that places no constraints on, and requires no changes to, the CMP process itself. Nor does it cause any reduction in range or uniformity. As will be seen, it can be applied in-situ or ex-situ, depending on the overall particular processing situation.

A routine search of the prior art was performed with the following references of interest being found:

U.S. Pat. No. 6,180,525(Morgan) shows a CMP process involving scratches. U.S. Pat. No. 5,915,175 (Wise) reveals a process to reduce CMP induced damage. U.S. Pat. No. 6,110,795 (Liao) and U.S. Pat. No. 5,516,729 (Dawson et al.) show CMP/scratch related processes.

SUMMARY OF THE INVENTION

It has been an object of at least one embodiment of the present invention to provide a process whereby micro-scratches caused by cMP, or similar processing steps, may be removed.

Another object of at least one embodiment of the present invention has been that said process require little or no modification to the CMP, or similar, process itself.

Still another object of at least one embodiment of the present invention has been that said process be executable in in-situ or ex-situ modes.

These objects have been achieved by exposing the surface under treatment to a gas plasma after CMP (or other process that could produce micro-scratches) has been completed. Additionally, the invention discloses that the small amount of material that gets removed through exposure to the plasma may be replaced by deposition either in-situ or ex-situ. The added material may be the same as the removed material or a different material.

BRIEF DESCRIPTION OF THE DRAWINGS

FIGS. 1 and 2 illustrate how micro-scratches may appear in a surface that has been subjected to CMP.

FIGS. 3 and 4 illustrate the basic approach taken by the present invention, namely exposure of the scratched surface to a gas plasma.

DESCRIPTION OF THE PREFERRED EMBODIMENTS

Figure 4:
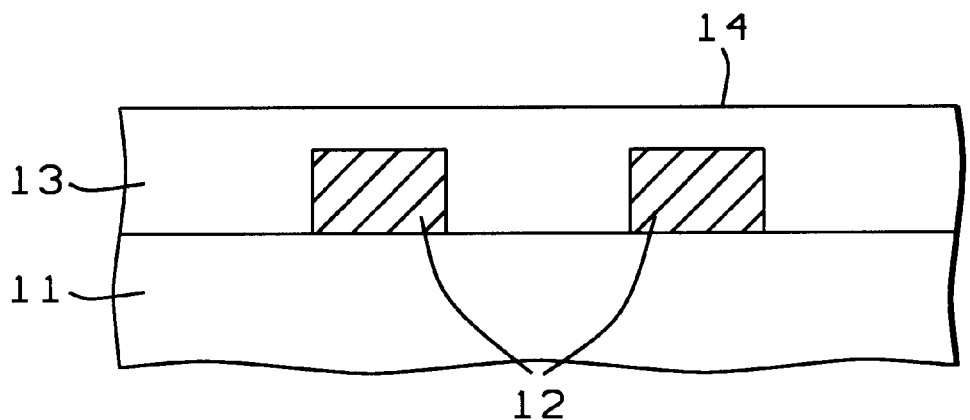

FIG. 3 illustrates a first embodiment of the invention. Shown there is the same surface we associated with the prior art in FIG. 2, including the exemplary micro-scratches 24. What is new is that said surface and scratches are now exposed to gas plasma 31, resulting in the selective removal of microscratches 24, as illustrated schematically in FIG. 4. The scratch-bearing surface needs to be exposed to the plasma for about 30 seconds. In the first embodiment, our preferred gas for the plasma has been either pure argon or a mixture of argon and oxygen up to about 70% oxygen by volume or chlorine. The surface under treatment may be allowed to float electrically relative to the plasma, RF power being between about 1,500 and 4,00 W. At the termination of this treatment said microscratches will all have been removed as well as between about 100 and 500 Angstroms of material all across the surface.

Figure 5:
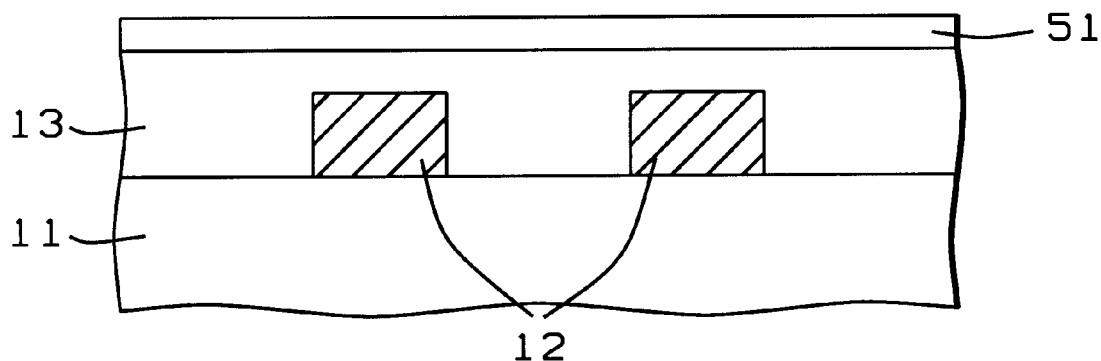
FIG. 5 shows the now scratch-free surface onto which a replacement layer has been deposited.

In second and third embodiments of the invention, not only is some material removed as part of the process of removing micro-scratches (between about 100 and 5,000 Angstroms), but a layer of replacement material (between about 200 and 2,000 Angstroms thick) is also deposited, thereby restoring the surface to approximately its original thickness, but with the micro-scratches now no longer present. This can be seen in FIG. 5 where layer 51 represents the replacement.

Thus, the process of the second and third embodiments involves first exposing the surface layer of a wafer to a gaseous plasma for about 30 seconds, thereby reducing the wafer's thickness and also removing from that surface any micro-scratches that previous processing might have generated thereon. The gaseous plasma could be pure argon, a mixture of argon and oxygen, or chlorine, while the surface layer in question could be any of silicon, silicon oxide, tungsten, copper, a low K dielectric, or fluorinated silica glass (FSG).

Examples of processes that could lead to micro-scratches include CMP, etching, photolithography, plasma vapor deposition, chemical vapor deposition, and wafer handling. After exposure to the plasma, a layer of a second material is deposited on the now scratch-free surface. This second material could be the same as the first material or it could be a different material such as a low K dielectric, TEOS oxide, silane oxide, silicon nitride, or FSG.

In the in-situ version of the invention (second embodiment), both exposure to the plasma and deposition of the replacement layer are performed in the same chamber, preferably without breaking vacuum between operations. Because of the in-situ requirement, some constraint is placed on the type of deposition method that can be used but examples of suitable deposition methods include chemical vapor deposition (CVD) and HDP (high density plasma) CVD.

In the ex-situ version of the invention (third embodiment), the scratch removal and deposition of the replacement layer are performed in separate apparatuses, with the scratch removal being performed first. In general, no more than about _____ minutes should elapse between the two operations and, where possible, the wafer should be stored under vacuum or an unreactive gas during its transfer between the apparatuses. Other than that, all operating conditions and limitations are the same for both the in-situ and ex-situ methods.

What is claimed is:

1. A process for removing micro-scratches, comprising:
   providing a surface containing said micro-scratches; and
   exposing said surface to a gaseous plasma, containing only argon, for a period of time, thereby removing said micro-scratches.

2. The process described in claim 1 wherein said period of time is about 30 seconds.

3. The process described in claim 1 wherein said micro-scratches are a result of a process selected from the group consisting of CMP, etching, photolithography, plasma vapor deposition, chemical vapor deposition, and wafer handling.

4. The process described in claim 1 wherein a layer of material, between about 100 and 5,000 Angstroms thick, is removed from said surface.

5. The process described in claim 1 wherein said surface is given a negative bias of between about 200 and 2,000 volts relative to said gaseous plasma.

6. An in-situ process for restoring a surface of a layer of a first material having a first thickness and containing micro-scratches, comprising:
   in a suitable apparatus, exposing said surface to a gaseous plasma, containing only argon, for a period of time, thereby reducing said thickness and removing said micro-scratches; and then
   in said suitable apparatus, depositing a layer of a second material to a second thickness whereby said layer is restored to about said first thickness and said surface is free of micro-scratches.

7. The process described in claim 1 wherein said period of time is about 30 seconds.

8. The process described in claim 6 wherein said micro-scratches resulted from a process selected from the group consisting of CMP, etching, photolithography, plasma vapor deposition, chemical vapor deposition, and wafer handling.

9. The process described in claim 6 wherein said first thickness is between about 100 and 5,000 Angstroms.

10. The process described in claim 6 wherein said second thickness is between about 100 and 5,000 Angstroms.

11. The process described in claim 6 wherein said first material is selected from the group consisting of silicon, silicon oxide, a low K dielectric, TEOS oxide, silane oxide, silicon nitride, and FSG.

12. The process described in claim 6 wherein said second material is the same as said first material.

13. The process described in claim 6 wherein said second material is selected from the group consisting of low K dielectrics, TEOS oxide, silane oxide, silicon nitride, and FSG.

14. The process described in claim 6 wherein said second material is deposited through a process selected from the group consisting of CVD and HDPCVD.

15. An ex-situ process for restoring a surface of a layer of a first material having a first thickness and containing micro-scratches, comprising:
   in a first apparatus, exposing said surface to a gaseous plasma, containing only argon, for a period of time, thereby reducing said thickness and removing said micro-scratches; and then
   in a second apparatus that is different from said first apparatus, depositing a layer of a second material to a second thickness whereby said layer is restored to about said first thickness and said surface is free of micro-scratches.

16. The process described in claim 15 wherein said period of time is about 30 seconds.

17. The process described in claim 15 wherein said micro-scratches resulted from a process selected from the group consisting of CMP, etching, photolithography, plasma vapor deposition, chemical vapor deposition, and wafer handling.

18. The process described in claim 15 wherein said first thickness is between about 100 and 5,000 Angstroms.

19. The process described in claim 15 wherein said second thickness is between about 100 and 5,000 Angstroms.

20. The process described in claim 15 wherein said first material is selected from the group consisting of silicon, silicon oxide, low K dielectrics, TEOS oxide, silane oxide, silicon nitride, and FSG.

21. The process described in claim 15 wherein said second material is the same as said first material.

22. The process described in claim 15 wherein said second material is selected from the group consisting of low K dielectrics, TEOS oxide, silane oxide, silicon nitride, and FSG.

23. The process described in claim 15 wherein said second material is deposited through a process selected from the group consisting of CVD and HDPCVD.

24. A process for removing micro-scratches, comprising:
   providing a surface containing said micro-scratches; and
   exposing said surface to a gaseous plasma, containing only argon and oxygen, for a period of time, thereby removing said micro-scratches.

25. An in-situ process for restoring a surface of a layer of a first material having a first thickness and containing micro-scratches, comprising:
   in a suitable apparatus, exposing said surface to a gaseous plasma, containing only argon and oxygen, for a period of time, thereby reducing said thickness and removing said micro-scratches; and then
   in said suitable apparatus, depositing a layer of a second material to a second thickness whereby said layer is restored to about said first thickness and said surface is free of micro-scratches.

26. An ex-situ process for restoring a surface of a layer of a first material having a first thickness and containing micro-scratches, comprising:

in a first apparatus, exposing said surface to a gaseous plasma, containing only argon and oxygen, for a period of time, thereby reducing said thickness and removing said micro-scratches; and then in a second apparatus that is different from said first apparatus, depositing a layer of a second material to a second thickness whereby said layer is restored to about said first thickness and said surface is free of micro-scratches.

* * * * *